United States Patent [19]

Coates

[11] 4,259,939
[45] Apr. 7, 1981

[54] FOUR LEAD MONOLITHIC DARLINGTONS

[75] Inventor: John P. Coates, London, England

[73] Assignee: Lumenition Limited, London, England

[21] Appl. No.: 76,567

[22] Filed: Sep. 18, 1979

[30] Foreign Application Priority Data

Oct. 2, 1978 [GB] United Kingdom ............... 38978/78

[51] Int. Cl.³ ............................................. F02P 3/06
[52] U.S. Cl. ................................. 123/605; 307/300; 307/303; 315/209 T
[58] Field of Search ........ 123/117 R, 148 E, 148 CB; 315/209 T; 307/300, 303

[56] References Cited

U.S. PATENT DOCUMENTS

| | | | |
|---|---|---|---|
| 4,072,981 | 2/1978 | Black et al. | 307/300 |
| 4,106,462 | 8/1978 | Hildebrandt et al. | 123/148 E |
| 4,122,814 | 10/1978 | Ford | 123/148 E |
| 4,140,926 | 2/1979 | Price | 307/300 |
| 4,147,145 | 4/1979 | Djinland et al. | 123/148 E |
| 4,188,929 | 2/1980 | Podrapsky et al. | 123/148 E |
| 4,188,930 | 2/1980 | Santi | 123/148 E |

Primary Examiner—Charles J. Myhre
Assistant Examiner—R. A. Nelli
Attorney, Agent, or Firm—Larson, Taylor and Hinds

[57] ABSTRACT

A monolithic Darlington in which the transistors forming the Darlington pair are formed on a substrate together with a fourth terminal in addition to the normal three terminals provided for a Darlington pair, the fourth terminal being connected to the base electrode of the second transistor and the emitter electrode of the first transistor. The addition of the fourth terminal enables a control circuit for controlling the rate of switch off to be connected between the fourth terminal and the command collector electrode, this removing the effect which the stored charge on the base electrode of the first transistor has on the switching rate of the Darlington pair, thus enabling a faster switching rate to be achieved.

3 Claims, 3 Drawing Figures

FOUR LEAD MONOLITHIC DARLINGTONS

FIELD OF THE INVENTION

The present invention relates to improvements in power Darlington transistors which are in particular used in opto-electronic ignition circuits.

DESCRIPTION OF THE PRIOR ART

A known form of Darlington pair comprises two NPN transistors having commoned collector electrodes, the emitter electrode of the first transistor being connected directly to the base electrode of the second transistor. A Darlington pair is thus a three terminal device having a first terminal connected to the commoned collector electrodes, a second terminal connected to the base electrode of the first transistor, and a third terminal connected to the emitter electrode of the second transistor.

In addition the power Darlington pair, which is available on the market as a monolithic Darlington transistor, is provided with two internal resistors formed on the same chip, the first resistor being connected between the base and emitter electrodes of the first transistor and the second resistor being connected between the base and emitter electrodes of the second transistor. Due to encapsulation of the power Darlington pair and its associated internal resistors, one does not normally have access to the base electrode of the second transistor.

We use a power Darlington pair as the power transistor for our opto-electronic ignition systems. One such opto-electronic ignition circuit is disclosed in U.S. Pat. No. 4,122,814.

The power Darlington pair which is in series with the primary winding of the ignition coil is associated with a circuit which not only controls the rate at which the power transistor can switch off, but also protects the transistors of the power Darlington pair against positive going transients. This circuit comprises a pair of series connected zener diodes, a capacitor connected in parallel therewith and a resistor connected in series with the parallel circuit, said circuit being connected between the commoned collector electrodes of the power Darlington pair and the base electrode of the first transistor.

In the event of a voltage appearing at the commoned collector electrodes in excess of the zener breakdown voltage, the power Darlington pair is partially turned on in a controlled manner with the aid of this circuit to remove the excess voltage arising due to transient phenomena. Thus, the voltage at the collector electrode cannot exceed the zener voltage during switch off. In order to prevent this voltage from being conducted to earth through the first conductive Darlington pair, a blocking diode is provided between the commoned collector electrodes of the first Darlington pair and the base electrode of the power Darlington pair.

One of the problems encountered in using Darlington pairs in the circuit disclosed in U.S. Pat. No. 4,122,814 is the stored base charge on the base electrode of the first transistor of the power Darlington pair. This cannot quickly be disposed of, i.e. shorted to earth, when the power Darlington pair switches off because the only path available is through the first Darlington pair which has just switched on, but this path is blocked by the diode between the commoned collector electrodes of the first Darlington pair and the base electrode of the first transistor of the power Darlington pair.

Because of the presence of the high stored base charge when the first transistor of the power Darlington pair is in the fully saturated condition, there is in fact a delay between the time that the first Darlington pair switches on and the time that the power Darlington pair switches off. This delay is approximately 30 μs.

Although not serious at normal engine speeds, this switching delay could cause problems in high performance engines at speeds in excess of 10,000 R.P.M.

SUMMARY OF THE INVENTION

It is therefore an object of the present invention to overcome partially or wholly the above mentioned disadvantage.

According to the present invention there is provided a monolithic Darlington comprising: a substrate on which the two transistors forming a Darlington pair are formed; and four terminals formed on the substrate, a first terminal being connected to the commoned collector electrodes of the transistors, a second terminal being connected to the base electrode of the first transistor, a third terminal being connected to the emitter electrode of the second transistor, and a fourth terminal being connected to the base electrode of the second transistor and also to the emitter electrode of the first transistor, said fourth terminal being available for external connection.

Preferably, between the commoned collector electrodes and said fourth terminal there is connected a circuit which firstly controls the rate at which the monolithic Darlington is permitted to switch off, when the bias which holds the Darlington pair in the conductive state is removed, and secondly protects the transistors against positive going transients appearing at the collector electrodes when the Darlington pair is non-conductive.

Said circuit preferably comprises a pair of zener diodes connected in series, a capacitor connected in parallel with the zener diodes, and a resistor connected in series with the parallel combination of the zener diodes and capacitor.

When the monolithic Darlington is used as the final stage in an opto-electronic ignition system, the blocking diode which was previously present between the base electrode of the first transistor of the Darlington pair can be omitted thus reducing the switching delay inherent in the system resulting from the stored base charge in the first transistor of the Darlington pair.

BRIEF DESCRIPTION OF THE DRAWINGS

The present invention will now be described in greater detail by way of examples with reference to the accompanying drawings wherein.

DESCRIPTION OF THE PREFERRED EMBODIMENT

Figure 1A:
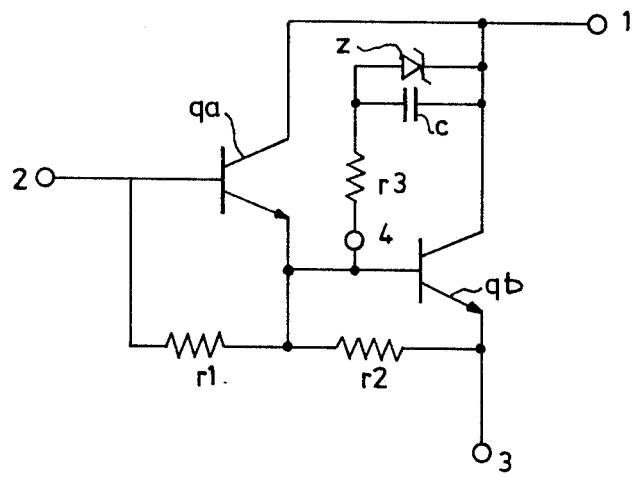
FIG. 1A is a circuit diagram of a monolithic Darlington having four terminals and associated control circuitry according to the present invention.

Referring first to FIG. 1, the monolithic Darlington comprises two transistors qa and qb. The monolithic Darlington device is provided with four connecting terminals 1 to 4 as follows:

The first terminal 1 is connected to the commoned collector electrodes of the transistors qa and qb.

The second terminal 2 is connected to the base electrode of the first transistor qa.

The third terminal 3 is connected to the emitter electrode of the second transistor qb.

The fourth terminal 4 is connected to the base electrode of the second transistor qb and also to the emitter electrode of the first transistor qa.

The monolithic Darlington also includes resistors r1 and r2 connected between the base and emitter electrodes of respective transistors qa and qb. These resistors are internally formed on the same substrate as the transistors.

A switching control and transient protection circuit is connected between the first and fourth terminals 1 and 4. In its simplest form, this circuit comprises a parallel combination of a zener diode z and a capacitor c, and a resistor r3 connected in series therewith. Thus, instead of this circuit being connected between the commoned collector electrodes and the base electrode of the first transistor, it is now connected between the collector and base electrodes of the second transistor qb.

Figure 1B:
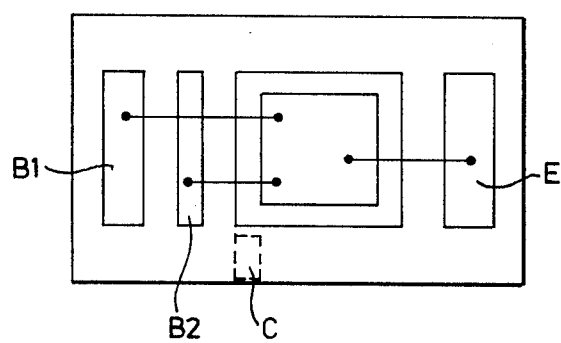
FIG. 1B is a diagram illustrating the internal connections on the chip of the four outside leads which are connected thereto.

As will be seen from the diagrammatic representation of the upper surface of the substrate on which the monolithic Darlingon is formed as shown in FIG. 1B, in addition to the metallizations which form the second and third terminals for first base B1 and the emitter E respectively, a fourth metallization is provided for the second base B2, it being appreciated that the metallization for the collector C is provided on the reverse side of the substrate.

Figure 2:
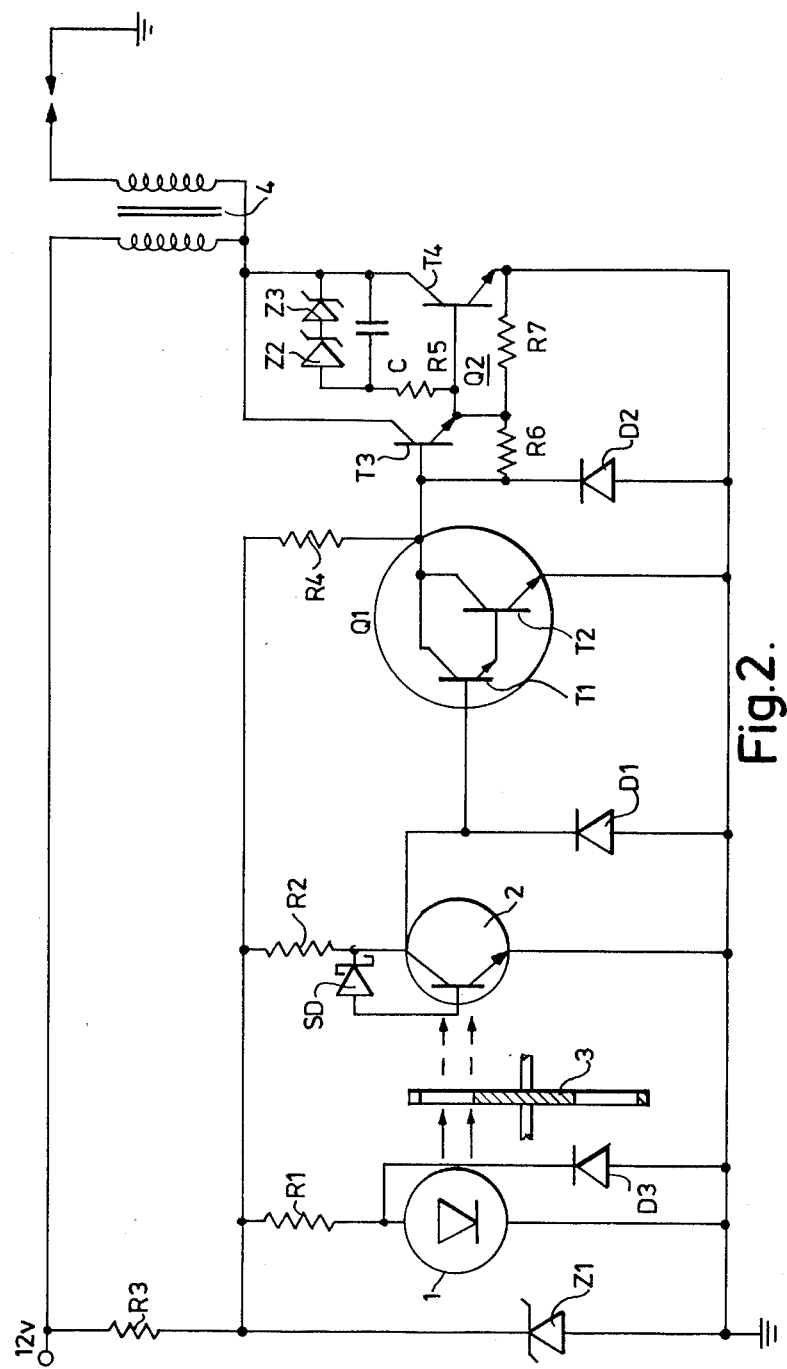
FIG. 2 is a circuit diagram of an opto-electronic ignition system to which the circuit shown is applied.

Referring to FIG. 2 the ignition circuit includes a solid state gallium arsenide lamp 1, a photo-transistor 2, and two Darlington pairs Q1 and Q2. The lamp 1 and the photo-transistor 2 are each in series with respective resistors R1 and R2, and receive a 7.5 volt stabilized supply from zener diode Z1. The zener diode is connected across the 12 volt battery of the vehicle through a resistor R3. A reverse diode D3 is connected across the lamp 1, in order to protect the lamp against negative going transients.

Connected across the emitter-collector electrodes of the photo-transistor 2 is a diode D1, which serves not only to ensure clean switching of the photo-transistor 2, but ensures that any negative transients on the line during the time that the photo-transistor is non-conductive are conducted past the photo-transistor, and are thus unable to cause any damage to its structure. A Schottky diode SD is connected across the base and collector electrodes of the photo-transistor 2, for the purpose of preventing the photo-transistor from becoming oversaturated due to excessive irradiation from the lamp 1.

The Darlington pairs Q1 and Q2 each consist of a pair of transistors T1, T2 and T3, T4 respectively, arranged in conventional Darlington configuration. The base electrode of the transistor T1 is connected to the collector electrode of the photo-transistor 2. The commoned collector electrodes of the transistors T1 and T2 are connected firstly to the base electrode of the transistor T3 of the second Darlington pair Q2, and, secondly, to the 7.5 volt zenered supply through a resistor R4.

A diode D2 is connected between the emitter electrode of the transistor T4 and the base electrode of the transistor T3. The diode D1 is likewise connected between the emitter electrode of the transistor T2 and the base electrode of the transistor T1. The diodes D1 and D2 serve to protect the Darlington pairs against negative going transients, and also against a careless mechanic connecting the battery the wrong way around. The diode D1 also serves to protect the photo-transistor 2 against reverse battery connection.

The commoned collector electrodes of the transistors T3 and T4 are connected to one end of the primary winding of the ignition coil 4, the other end of which is connected to the positive terminal of the 12 volt battery. Between the commoned collector electrodes of the transistors T3 and T4, and the base electrode of the transistor T4, there is connected a circuit comprising a pair of series connected zener diodes Z2 and Z3, a capacitor C connected in parallel with the zener diodes Z2 and Z3, and a resistor R5 connected in series with the parallel circuit comprising the capacitor C and zener diodes Z2 and Z3.

The operation of the circuit shown in FIG. 2, is basically the same as disclosed in U.S. Pat. No. 4,122,814 with the exception that due to the fact that the stored base charge on the base electrode of the transistor T3 can now be shorted to earth as soon as the Darlington pair Q1 becomes conductive, the delay in which the power Darlington pair responds to start switching off is reduced by a factor of about 3, i.e. from 30 $\mu$s to 10 $\mu$s.

Owing to the fact that the zener control circuit is connected to the base electrode of the transistor T4 the value of the capacitor C would need to be raised to about 2000 pF. Moreover, as the zener control circuit only operates on the output stage of the power Darlington pair and not the driver stage as well, the zener control and protection circuit could be universally applied to all types of Darlington pairs, since only the characteristics of the output stage of the Darlington have to be taken into consideration.

Additionally, the removal of the blocking diode not only reduces the delay time by a factor of 3 but also enhances the reliability of the circuit, since there is now one less component therein.

A further advantage arising out of the power Darlington pair, when used in an ignition circuit is that due to the controlled switch off, no radio interference is generated by the ignition coil.

What I claim and desire to secure by Letters Patent is:

1. The combination of a monolithic Darlington and a control circuit for controlling the rate at which the monolithic Darlington is permitted to switch off; said monolithic Darlington comprising first and second transistors connected so that the collectors thereof are common and the emitter of the first transistor is connected to the base of the second transistor forming an intermediate emitter-base junction therebetween, and said combination including four terminals formed on a silicon wafer and interconnected such that a first terminal is connected to the common collectors, a second terminal is connected to the base of the first transistor, a third terminal is connected to the emitter of the second transistor, and the fourth terminal is connected to the intermediate emitter-base junction of the two transistors; said control circuit being connected between the first terminal and the fourth terminal.

2. The combination according to claim 1, wherein said control circuit comprises at least one zener diode, a capacitor connected in parallel with the zener diode, and a resistor connected in series with the parallel combination of the zener diode and the capacitor.

3. An opto-electronic ignition system incorporating the combination according to claim 2, wherein said monolithic Darlington forms the final stage of a series of inverse switching Darlington pairs in a transistor chain, said combination being connected in series with the primary winding of an ignition coil.

* * * * *